(12) United States Patent
Van De Goor

(10) Patent No.: US 6,605,824 B2
(45) Date of Patent: Aug. 12, 2003

(54) SEMICONDUCTOR DRIVE

(75) Inventor: Albertus Theodorus Maria Van De Goor, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/829,860

(22) Filed: Apr. 10, 2001

(65) Prior Publication Data

US 2001/0048105 A1 Dec. 6, 2001

(30) Foreign Application Priority Data

Apr. 12, 2000 (NL) .......................................... 00201316

(51) Int. Cl.[7] .............................................. H01L 23/58
(52) U.S. Cl. .......................... 257/48; 257/48; 257/459; 257/762; 257/759; 438/11; 438/14; 438/15; 438/18
(58) Field of Search .................... 257/459, 48, 762, 257/759; 438/11, 14, 15, 18

(56) References Cited

U.S. PATENT DOCUMENTS

| 5,920,081 A | 7/1999 | Chen et al. ..................... 257/48 |
| 5,981,302 A | 11/1999 | Alswede et al. ............... 438/15 |
| 6,232,662 B1 * | 5/2001 | Saran .......................... 257/750 |
| 6,297,563 B1 * | 10/2001 | Yamaha ....................... 257/781 |

FOREIGN PATENT DOCUMENTS

| EP | 0340727 A2 | 8/1989 | ........... H01L/23/52 |
| JP | 1296834 A | 11/1989 | |

* cited by examiner

Primary Examiner—Sara Crane
Assistant Examiner—Junghwa Im
(74) Attorney, Agent, or Firm—Aaron Waxler

(57) ABSTRACT

The invention relates to a semiconductor device comprising a bond pad structure, which bond pad structure enables analyses to be carried out at a level of a metal layer of the semiconductor device and comprises a matrix comprising trenches filled with a conductive material, which matrix is electrically contacted by the metal layer.

5 Claims, 2 Drawing Sheets

SEMICONDUCTOR DRIVE

BACKGROUND OF THE INVENTION

The present invention relates to the field of semiconductor devices and more specifically to integrated circuits (ICs) having bond pads incorporated therein. More particularly, the invention relates to a semiconductor device comprising a new bond pad structure which enables measurements, especially PCM measurements, to be carried out on bond pads based on soft metals, such as AlCu bond pads. The semiconductor device can be, for example, a CMOS or BICMOS integrated circuit.

In this description, reference will be made to the drawings, wherein FIGS. 1 to 3 illustrate problems known in the art, and FIGS. 4 and 5 illustrate the solution in accordance with the present invention.

It is well-known that when a silicon wafer is probed in an electrical test or the like, the test needle may damage the soft surface of the bond pad, especially when AlCu bond pads are used. As shown in FIG. 1 of the drawings, a bond pad 1 of AlCu is subjected to an electrical test using a probe needle 2. The probe needle 2 damages the soft surface, forming a so-called curl 3.

During subsequent processing comprising the application of an intermetal dielectric material 4 and subsequently chemical mechanical polishing (CMP) to planarize the structure (see FIG. 2), part of the curl may become exposed (exposed curl 3a).

In further processing steps, this curl 3a, which is exposed by CMP, may give rise to corrosion on the bond pad as illustrated in FIG. 3, wherein 3b is a corroded spot originating from the exposal curl 3a.

In Japanese patent application no. 64-296834, it has been proposed to overcome the problem associated with this type of analysis by dividing a pad part into a bonding pad part and a pad part used for sensing. The probe needle is brought into contact only with the latter pad part, which is allowed to be damaged. The bonding pad part is not damaged so that wire bonding is not adversely effected by damaged surfaces.

U.S. Pat. No. 5,920,081 focuses more on avoiding contamination of the probe needle. For this purpose, the probe needle should not contact the soft AlCu bond pad surface. To achieve this, a layer of tungsten is selectively deposited on the AlCu bond pad surface. This tungsten layer serves as a top metal on the bond pad, and the probe pin only contacts this tungsten layer.

SUMMARY OF THE INVENTION

Bond pads are typically disposed above one or more layers or stacks of brittle and/or soft intermetal dielectric materials, such as silicon oxides and organic materials.

In accordance with the present invention, it has now been found that the problem associated with damage to a metal surface of a bond pad structure can be overcome by using a new type of bond pad structure. More in particular, in accordance with the present invention, the structure of the bond pad which must be probed is changed in such a manner that the probe needle does not touch the soft AlCu directly.

More in detail, the present invention relates to a semiconductor device comprising a bond pad structure, which bond pad structure enables analyses to be carried out at a level of a metal layer of the semiconductor device and comprises a matrix comprising trenches filled with a conductive material, which matrix is electrically contacted by the metal layer. Preferably, the conductive material is a metal, particularly a material that can be polished by using chemical mechanical polishing. Very suitable materials are tungsten and copper. The metal layer may be shaped in any form to establish the electrical contact with the matrix. However, in order to reach a relatively low electrical resistance, electrical contact is advantageously made between the matrix and a ring of the metal layer.

The semiconductor device of the present invention can be advantageously manufactured in all IC processes which use an AlCu bottom layer in the bond pad structure and which use more than this one metallization layer, e.g. CMOS18 and CMOS15 processes.

The solution provided by the semiconductor device of the present invention has the advantage that transistor parameters can already be measured at an early stage of the overall processing treatment, viz. at the stage where a first metal layer of a bond pad structure is applied. This enables a fast feedback of results from experiments performed on the transistors and enables early process monitoring.

Therefor, the present invention also relates to a method of testing electrical parameters of a semiconductor device comprising a bond pad structure, which bond pad structure enables analyses to be carried out at a level of a metal layer of the semiconductor device and comprises a matrix comprising trenches filled with a conductive material, which matrix is electrically contacted by the metal layer, in which method the matrix is contacted by a probe needle.

DETAILED DESCRIPTION OF THE INVENTION

Figure 1:
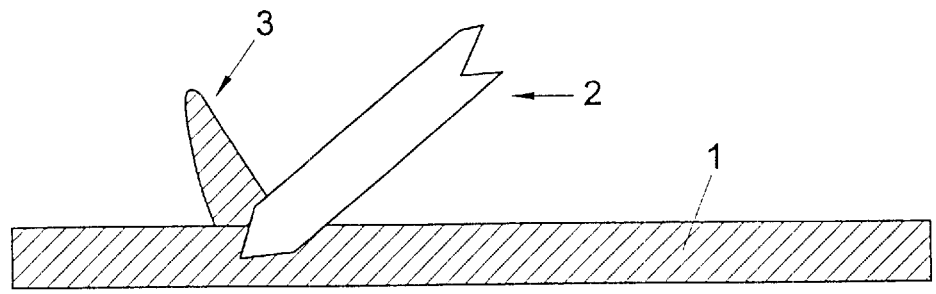
FIG. 1 depicts a bond pad subjected to a probe.
Figure 2:
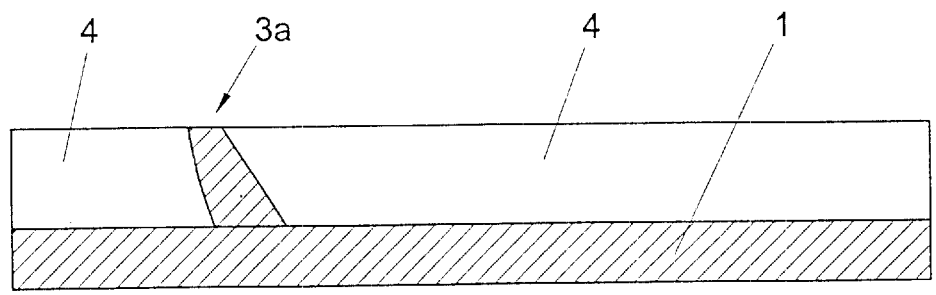
FIG. 2 depicts a deformed bond pad.
Figure 3:
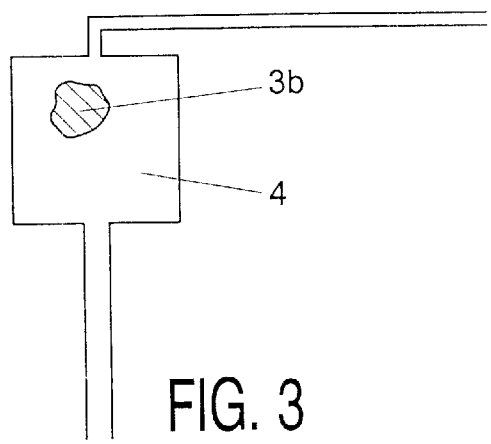
FIG. 3 depicts a top view of a deformed bond pad structure.
Figure 4:
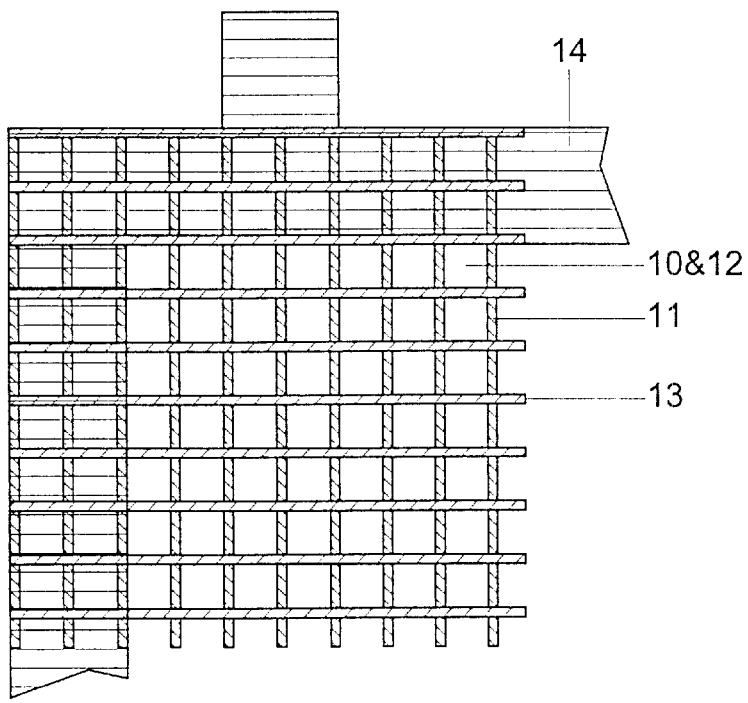
FIG. 4 depicts a top view of a bond pad having a matrix in accordance with the present invention.

The present invention will now be described in further detail, with reference to FIGS. 4 and 5. FIG. 4 shows a schematic top view of a bond pad structure of the semiconductor device in accordance with the present invention. This top view shows a layered structure, wherein the bottom layer above a semiconductor structure, e.g. a MOS structure, is a layer 10 of a dielectric material, generally $SiO_2$, wherein trenches 11 are etched, which trenches are filled with a conductive material, such as a metal like tungsten or copper, or a metal alloy like AlCu. The conductive material lying outside the trenches is removed by means of metal CMP. The width and spacing of the trenches are selected in such a way that CMP related problems like dishing do not degrade, or otherwise adversely affect, the shape and depth of the filled trenches 11. On top of the layer 10 and the filled trenches 11, a second layer 12 of dielectric material is deposited. Trenches 13 are etched into this layer 12 and filled in the same way as in the first layer 10, thus forming filled trenches 13. The trenches 11 and the trenches 13, which are both filled with conductive material, are formed in such a way that these form the matrix to be touched by the probe needle. This matrix is electrically contacted by a ring of metal 14.

Figure 5:
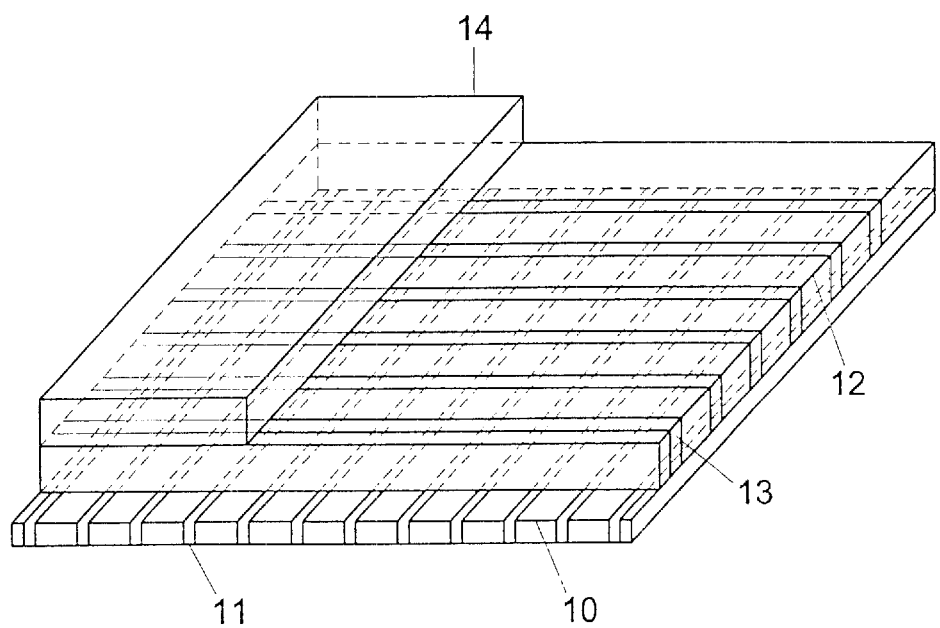
FIG. 5 depicts an isometric view of the bond pad of FIG. 4.

FIG. 5 is a three-dimensional view of the bond pad structure of the semiconductor device in accordance with the invention, showing the matrix comprised of the trenches 11 filled with conductive material, which trenches are present in the dielectric layer 10, and the trenches 13 filled with conductive material, which trenches are present in the second dielectric layer 12. On top of the matrix a ring of metal 14 is applied, which electrically contacts the matrix.

The matrix can, for example, comprise narrow contact and local interconnect line trenches filled with, for example, tungsten.

What is claimed is:

1. A semiconductor device comprising a bond pad structure, which bond pad structure enables analyses to be carried out at a level of a metal layer of the semiconductor device and comprises a matrix comprising trenches filled with a conductive material, which matrix is electrically contacted by a ring of the metal layer.

2. A semiconductor device as claimed in claim 1, wherein the conductive material is a metal.

3. A semiconductor device as claimed in claim 1, wherein the conductive material can be polished by chemical mechanical polishing.

4. A semiconductor device as claimed in claim 1, wherein the conductive material is selected from the group consisting of tungsten and copper.

5. A semiconductor device comprising a bond pad structure that enables analyses to be carried out at a level of a metal layer of the semiconductor device, wherein the bond pad structure includes a conductive matrix in contact with a ring of the metal layer and wherein the conductive matrix comprises:

a first set of trenches oriented in a first direction embedded in a first dielectric layer; and a second set of trenches oriented in direction perpendicular to the first direction embedded in a second dielectric layer.

* * * * *